(12) United States Patent
Song et al.

(10) Patent No.: US 6,784,369 B2
(45) Date of Patent: Aug. 31, 2004

(54) CONNECTION STRUCTURE OF COAXIAL CABLE

(75) Inventors: Ii-jong Song, Suwon (KR); Ja-nam Gu, Suwon (KR)

(73) Assignee: Samsung Electronics Co., Ltd., Kyungki-do (JP)

( * ) Notice: Subject to any disclaimer, the term of this patent is extended or adjusted under 35 U.S.C. 154(b) by 0 days.

(21) Appl. No.: 10/216,570

(22) Filed: Aug. 12, 2002

(65) Prior Publication Data

US 2003/0042041 A1 Mar. 6, 2003

(30) Foreign Application Priority Data

Sep. 1, 2001 (KR) ........................................ 2001-53685

(51) Int. Cl.[7] .............................................. H02G 15/02
(52) U.S. Cl. ........................................ 174/78; 174/251
(58) Field of Search ......................... 174/78, 250, 251, 174/268; 343/795, 830, 846, 822, 700 MS; 439/63, 581

(56) References Cited

U.S. PATENT DOCUMENTS

| | | | | |
|---|---|---|---|---|
| 4,063,246 A | * | 12/1977 | Greiser | ................ 343/700 MS |
| 5,120,258 A | * | 6/1992 | Carlton | ........................ 439/581 |
| 5,293,175 A | * | 3/1994 | Hemmie et al. | ............. 343/795 |
| 5,828,340 A | * | 10/1998 | Johnson | ............... 343/700 MS |
| 6,452,379 B1 | * | 9/2002 | Cartier | .................... 324/158.1 |
| 6,483,464 B2 | * | 11/2002 | Rawnick et al. | ..... 343/700 MS |

* cited by examiner

*Primary Examiner*—Chau N. Nguyen
(74) *Attorney, Agent, or Firm*—Sughrue Mion, PLLC

(57) ABSTRACT

A connection structure includes an external conductor of a coaxial cable which is electrically connected to a ground conductor installed at a surface of a planar circuit substrate, and an internal conductor of the coaxial cable which is connected to a micro strip line installed at the other surface of the planar circuit substrate. The internal conductor of the coaxial cable is welded to a conductive pattern of the micro strip line. The conductive pattern of the micro strip line includes a conductive welding portion welded to the internal conductor of the coaxial cable, a conductive landing portion extending from the conductive welding portion in a predetermined width, and an impedance converting portion whose width increases as it extends from the conductive landing portion.

11 Claims, 5 Drawing Sheets

CONNECTION STRUCTURE OF COAXIAL CABLE

BACKGROUND OF THE INVENTION

1. Field of the Invention

The present invention relates to a microwave system and other high-frequency systems and, more particularly, to a connection structure for connecting a coaxial cable with a planar circuit substrate of a high-frequency system.

2. Description of the Related Art

Recently, various apparatuses including a high-frequency circuit, such as mobile communication devices, have been used. In most cases, a high-frequency circuit using a high frequency of no less than 5 MHz, such as a microwave frequency, is mounted on a planar printed circuit board.

A coaxial cable is a medium capable of transmitting both an analog signal and a digital signal and has the structure shown in FIG. 1. In FIG. 1, in a coaxial cable 10, an internal conductor 2 is covered with an internal insulator 4 formed of dielectric material. The internal insulator 4 is covered with an external conductor 6, and the external conductor 6 is covered with an external insulator 8. Since the coaxial cable 10 is not considerably affected by external electromagnetic fields and has a low power loss, the coaxial cable 10 generally has been used for such high-frequency systems.

The coaxial cable 10 transmits high-frequency signals, inputted from a tester and other types of systems to a high-frequency device mounted on a planar printed circuit board of a high-frequency system. While the coaxial cable 10 provides a radially symmetric transmission structure for the signals, the transmission structure within the high-frequency device of the high frequency system is inherently planar. In addition, in a case where the signals are within a microwave or millimeter wave frequency range, discontinuities at an interface caused by the difference between the radially symmetric transmission structure and the planar transmission structure cause impedance mismatches that degrade the performance of systems.

In addition, a connector is generally required to mount the coaxial cable 10 having the radially symmetric transmission structure on a printed circuit board having the planar transmission structure.

FIG. 2 is a cross-sectional view illustrating a planar circuit substrate coupled with a coaxial cable using a connector disclosed in U.S. Pat. No. 5,797,765.

In FIG. 2, a planar substrate 12 has a conductive hole 16 and a contact pad 14 which is formed at the surface of the planar substrate 12. A connector 18 includes a conductive disk 22 which has a hole H and an edge 20 of an oblique angle, a protrusion 24 concentrically arranged in the hole 16, a cylinder-shaped sleeve 26 extending from the bottom surface of the conductive disk 22, and an internal conductor 28 positioned along the axis of the cylinder-shaped sleeve 26. The protrusion 24 is positioned in the conductive hole 16, and the internal conductor 28 is positioned at the center of the conductive hole 16.

However, the use of the connector 18 increases the volume of a system and the cost of manufacturing the system. In addition, the problem of impedance mismatches caused by discontinuities at an interface is not considered in the disclosure of U.S. Pat. No. 5,797,765. Moreover, since U.S. Pat. No. 5,797,765 discloses that the internal conductor 28 is wire-bonded by a wire 23 to a strip line 15, it is not appropriate for mass production of the system.

SUMMARY OF THE INVENTION

To solve the above-described problems, it is an aspect of the present invention to provide a connection structure of a coaxial cable which is capable of easily connecting the coaxial cable to a planar circuit substrate without using a connector.

To further solve the above-described problems, it is an aspect of the present invention to provide a connection structure of a coaxial cable which is capable of improving the transmission performance of the coaxial cable by minimizing impedance mismatches caused by discontinuities at a structural interface.

An apparatus consistent with the present invention relates to a connection structure, in which an external conductor of a coaxial cable is electrically connected to a ground conductor installed at a surface of a planar circuit substrate and an internal conductor of the coaxial cable is connected to a micro strip line installed at the other surface of the planar circuit substrate, the internal conductor of the coaxial cable being welded to a conductive pattern of the micro strip line, and the conductive pattern of the micro strip line comprising a conductive welding portion welded to the internal conductor of the coaxial cable, a conductive landing portion extending from the conductive welding portion in a predetermined width, and an impedance converting portion whose width increases as it extends from the conductive landing portion.

According to the present invention, the connection structure includes a coaxial cable and a planar circuit substrate which are connected, for example, by welding, soldering, or conductive adhesive, without using additional connectors. Thus, the connection structure is not only cost-effective but is also suitable for mass production due to its simplicity.

In addition, the present invention minimizes impedance mismatches caused by discontinuities at a structural interface such as a connection of a cylinder-shaped coaxial cable and a planar circuit substrate, by equipping a micro strip line with an impedance converting portion which increases in width from one end to the others.

It is preferable that at least one via hole is formed in a predetermined pattern surrounding the conductive welding portion. According to the present invention, the via hole improves signal transmission abilities of the coaxial cable by guiding signals transmitted from the coaxial cable. In addition, it is preferable that at least two via holes are formed in a symmetrical pattern.

According to the present invention, a test shows that the via holes, which are arranged in a symmetrical pattern, guide signals transmitted through the internal conductor. In addition, the conductive welding portion may be circular. It is possible to guarantee room for other circuits by forming the conductive welding portion in a circular shape; thus, minimizing the space occupied by the conductor.

Preferably, the coaxial cable is vertically coupled with the planar circuit substrate to reduce the loss of signal-and to simplify the manufacturing process, in comparison to the horizontally connected coaxial cable and the planar circuit substrate.

To further solve the above-described problems, another aspect of the present invention is to provide a connection structure, in which an external conductor of a coaxial cable is electrically connected to a ground conductor installed at a surface of a planar circuit substrate and an internal conductor of the coaxial cable is connected to a micro strip line installed at the other surface of the planar circuit substrate, wherein at least one via hole is prepared by a predetermined method in a predetermined pattern in the planar circuit substrate around the internal conductor of the coaxial cable coupled with a portion of the micro strip line by a predetermined method. Here, it is preferable to form at least two via holes in a symmetrical pattern.

According to the present invention, it is possible to improve signal transmission characteristics by forming a via hole in the place where a coaxial cable and a planar circuit board are connected, and guiding signals transmitted through the internal conductor of the coaxial cable. The via hole can be used in a configuration according to the present invention in which no additional connector is required, and in other existing configurations having a connector.

According to the present invention, it is preferable that a conductive pattern of the micro strip line comprises a conductive welding portion welded to the internal conductor of the coaxial cable, a conductive landing portion extending from the conductive welding portion on the same plane as the conductive welding portion, and an impedance converting portion extending from the conductive landing portion with an increasing width.

According to the present invention, it is possible to improve signal transmission characteristics by guiding signals by a via hole and by setting a characteristic impedance with a predetermined value by configuring a micro strip line as described above.

BRIEF DESCRIPTION OF THE DRAWINGS

The above aspects and advantages of the present invention will become more apparent by describing in detail illustrative, non-limiting embodiments thereof with reference to the accompanying drawings, in which.

DETAILED DESCRIPTION OF THE INVENTION

Figure 1:
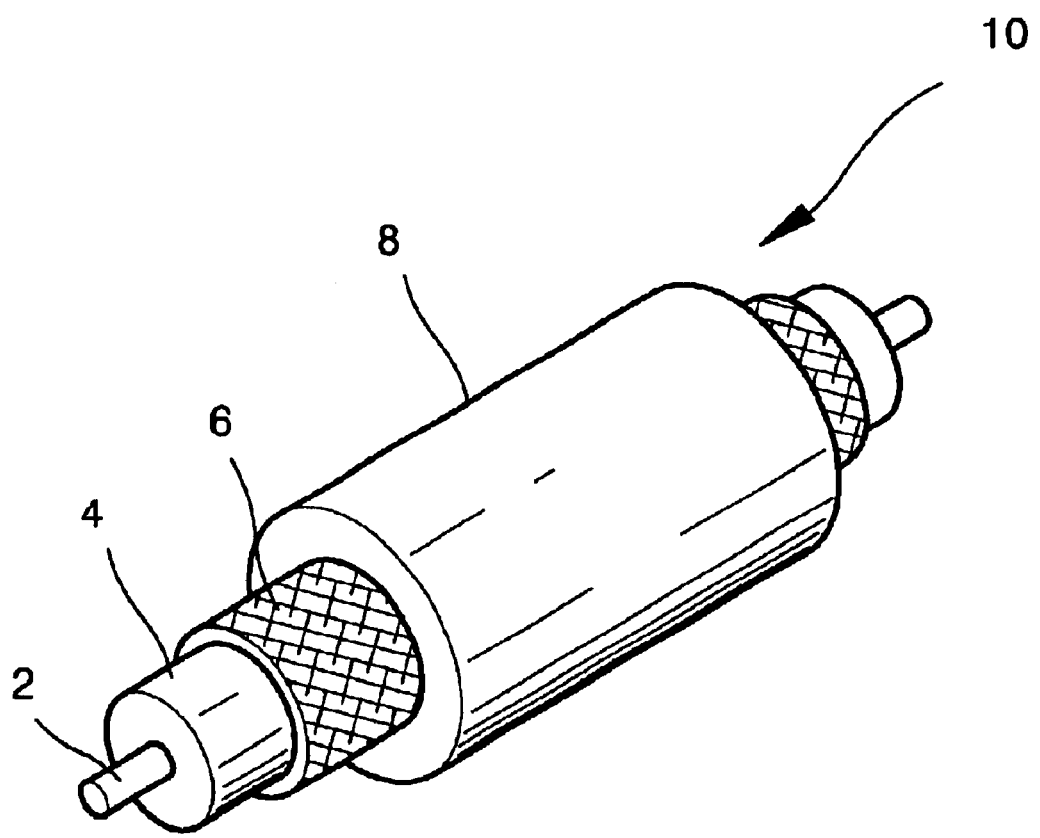
FIG. 1 is a perspective view illustrating a conventional coaxial cable.
Figure 2:
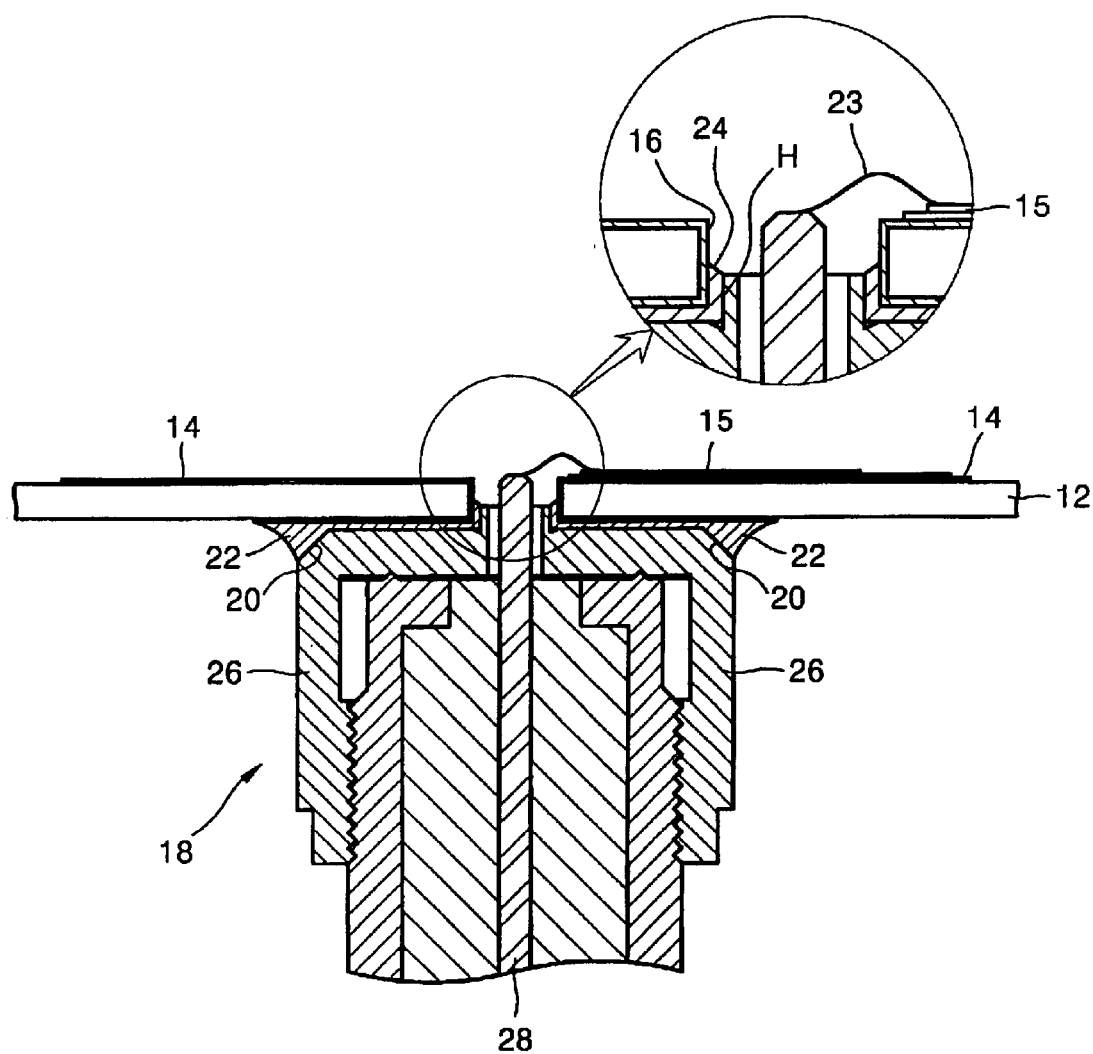
FIG. 2 is a cross-sectional view illustrating a planar circuit substrate coupled with a coaxial cable by a conventional connection method.

The present invention will now be described in detail by describing illustrative, non-limiting embodiments thereof with reference to the accompanying drawings. In the drawings, the same reference characters denote the same elements.

Figure 3:
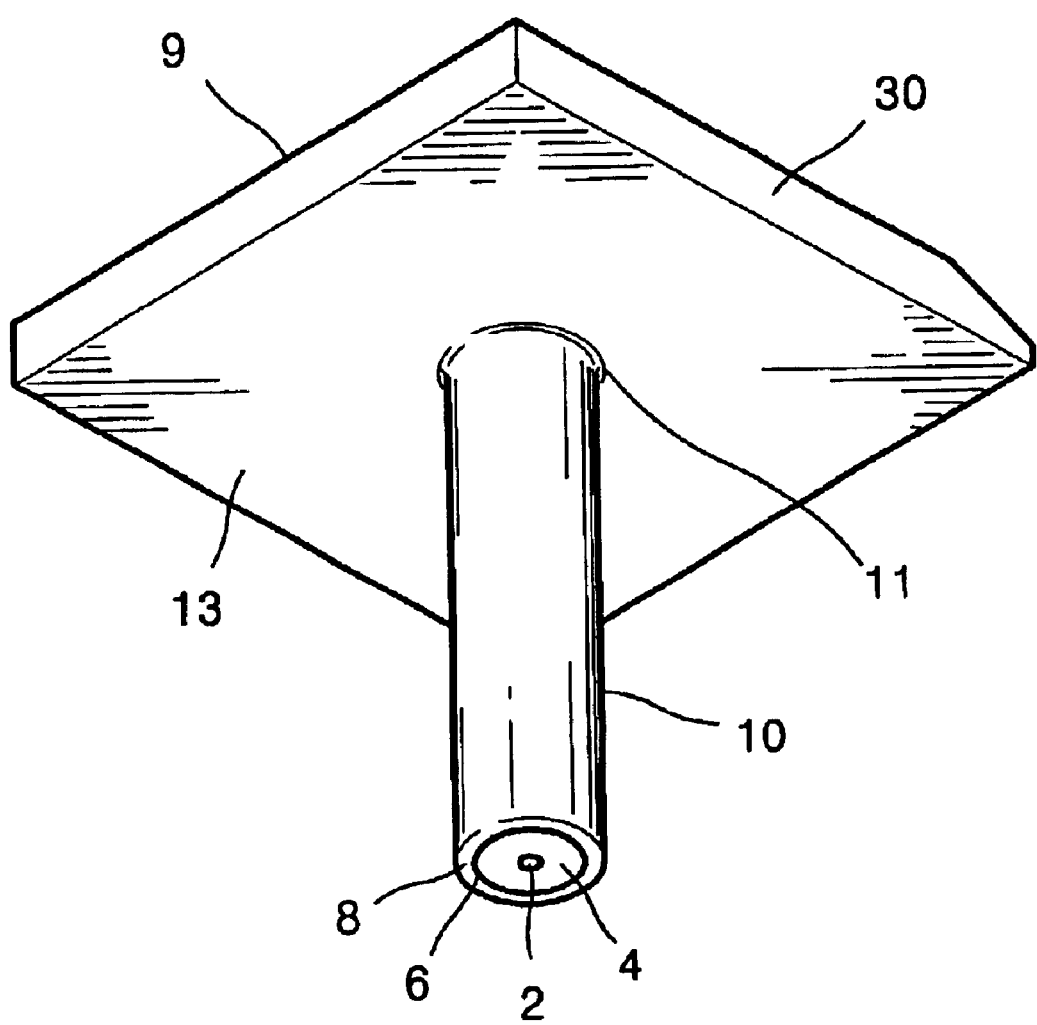
FIG. 3 is a perspective view illustrating the vertical connection of a planar circuit substrate and a coaxial cable according to an illustrative, non-limiting embodiment of the present invention.

FIG. 3 is a diagram illustrating the vertical connection of a planar circuit substrate 30 and a coaxial cable 10 according to an illustrative, non-limiting embodiment of the present invention. The coaxial cable 10, as shown in FIG. 1, includes an internal conductor 2 formed of a copper wire, an internal insulator 4 formed of dielectric material to cover the internal conductor 2, an external conductor 6 formed to cover the internal insulator 4, and an external insulator 8 formed to cover the external conductor 6. The coaxial cable 10 is connected to a surface of the planar circuit substrate 30.

Figure 4:
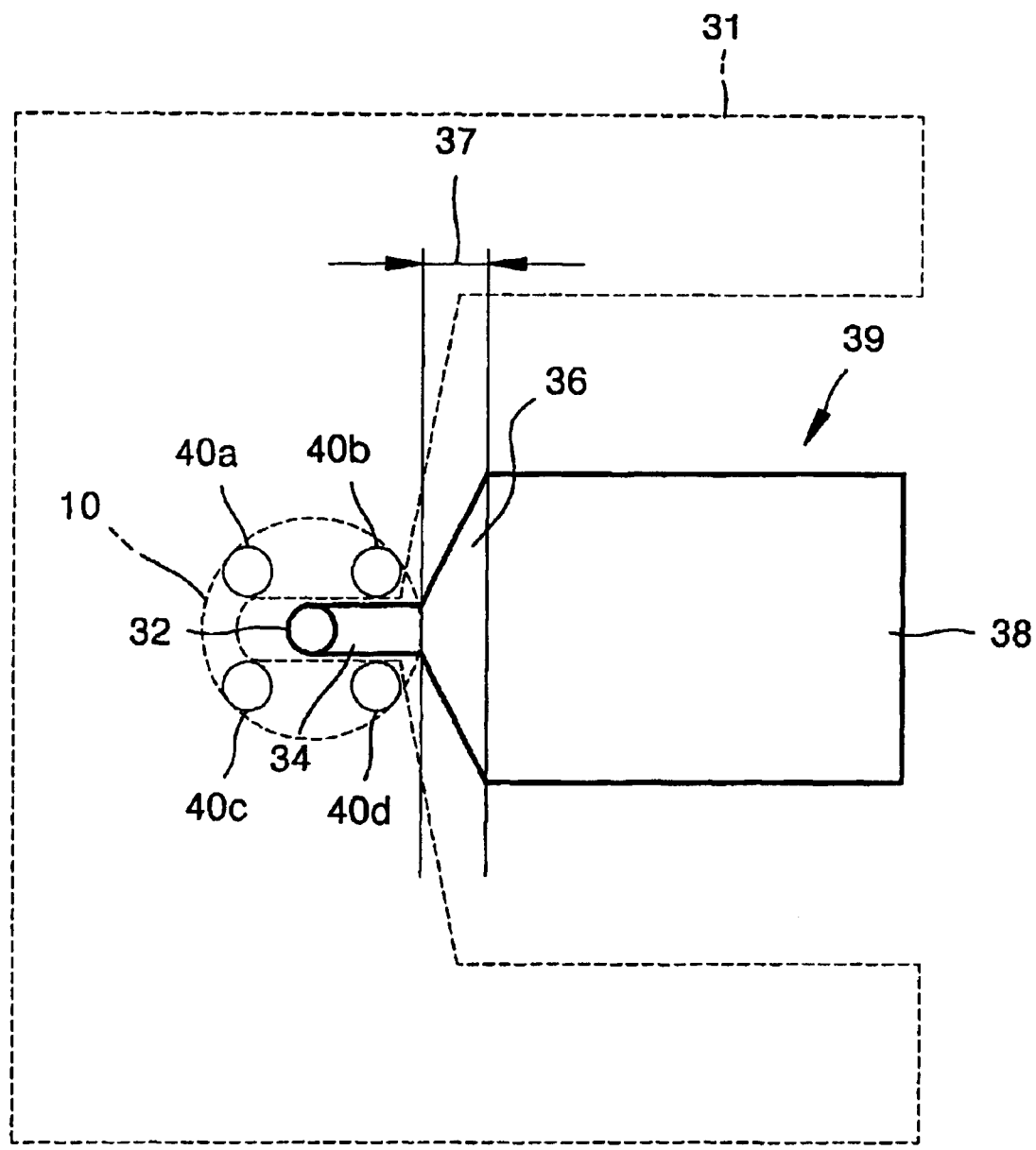
FIG. 4 is a diagram illustrating the connection of a micro strip line of a planar circuit substrate and an internal conductor of a coaxial cable according to an illustrative, non-limiting embodiment of the present invention.

The planar circuit substrate 30 has two surfaces including a top surface 9 and a bottom surface 13. On the top surface 9 of the planar circuit substrate 30, a micro strip line 39 shown in FIG. 4, is installed for transmitting electric signals to a circuit device. A ground conductor 31 is formed at a predetermined location on the bottom surface 13 of the planar circuit substrate 30.

The coaxial cable 10 is coupled with a surface of the planar circuit substrate 30, for example, with the bottom surface 13 of the planar circuit substrate 30. Specifically, the ground conductor 31 formed on the bottom surface 13 of the planar circuit substrate 30 is coupled with the external conductor 6 of the coaxial cable 10 by soldering or is bonded to the external conductor 6 of the coaxial cable 10 with the use of conductive resin. For example, reference numeral 11 represents the shape of the external conductor 6 and the ground conductor after being soldered together.

According to the present invention, the coaxial cable 10 is vertically coupled with the planar circuit substrate 30. If so, impedances can be easily matched, and actually, it is easier to vertically couple the coaxial cable 10 and the planar circuit substrate 30 by welding than to horizontally couple them. However, the present invention is not limited to the illustrative embodiment of vertically coupling the coaxial cable 10 with the planar circuit substrate 30. The present invention can also be applied to the horizontal coupling.

According to the description above, in the present invention, the coaxial cable 10 is vertically coupled with the planar circuit substrate 30, for example, by soldering without using a connector. However, impedance discontinuities occur at the soldered portion between the coaxial cable 10 and the planar circuit substrate 30 resulting in degraded transmission characteristics of the coaxial cable 10. Accordingly, signals to be transmitted through the coaxial cable 10 are poorly guided at the soldered portion and are scattered, resulting in the deterioration of the signals' characteristics. The above-described problems, which may occur when the coaxial cable 10 is coupled with the planar circuit substrate 30 by soldering without using a connector, are solved by the present invention, according to the description below.

The connection of a micro strip line 39 positioned on the top surface 9 of the planar circuit substrate 30 with the coaxial cable 10 will be described with reference to FIG. 4. FIG. 4 is a top view illustrating the planar circuit substrate 30. Circuit devices that are not required to couple the coaxial cable 10 with the planar circuit substrate 30 are not illustrated in FIG. 4.

The micro strip line 39 includes a circular conductive welding portion 32, a conductive landing portion 34, an impedance converting portion 36, and a body portion 38 which extends from the end of the impedance converting portion 36 and has a predetermined width.

A conductive welding portion 32 is located at the end of the micro strip line 39 and is welded to the internal conductor 2 of the coaxial cable 10 by soldering. The conductive welding portion 32 is preferably formed to be circular in order to minimize the area of the conductive welding portion 32 being welded and thus maximize an area that will be occupied by other circuit devices. The conductive landing portion 34 has a predetermined width and extends from the conductive welding portion 32. The impedance converting portion 36 extends for a distance 37 from the end of the conductive landing portion 34 and is formed with an increasing width to make the change in width between the conductive landing portion 34 and the body portion 38 gradual, and thus, reduce impedance at the connection interface. The impedance converting portion 36 is introduced to prevent the performance of the coaxial cable 10 from deteriorating. This deterioration is due to structural mismatches caused by the combination of the cylinder-shaped, coaxial cable 10 and the planar circuit substrate 30 or due to impedance mismatches generated by soldering at a discontinuous portion on the bottom surface 13 of the planar circuit substrate 30. The length and width of the conductive landing portion 34 and the length and width of the impedance converting portion 36 may be varied according to the dielectric constant of the planar circuit substrate 30.

Preferably, one or more via holes 40a, 40b, 40c, and 40d are formed in the planar circuit substrate 30 to be symmetrical and surround the conductive welding portion 32 by drilling into predetermined portions of the planar circuit substrate 30. The via holes 40a, 40b, 40c, and 40d may be formed in the planar circuit substrate 30, to contact both the coaxial cable 10 and the planar circuit substrate 30. Specifically, the via holes 40a, 40b, 40c, and 40d may be formed at predetermined locations of the planar circuit substrate 30, that contact the external conductor 6 of the coaxial cable 10. Alternatively, the via holes 40a, 40b, 40c, and 40d may be formed out of the contact between the coaxial cable 10 and the planar circuit substrate 30. The position of the via holes 40a, 40b, 40c, and 40d, like the length and width of each element of the micro strip line 39, may vary according to the dielectric constant of the planar circuit substrate 30.

The via holes 40a, 40b, 40c, and 40d can sufficiently guide signals transmitted along the coaxial cable 10. In other words, the via holes 40a, 40b, 40c, and 40d can guide the signals transmitted along the coaxial cable 10 so that the signals do not scatter outside of the coaxial cable 10.

The via holes 40a, 40b, 40c, and 40d are formed in a symmetrical pattern to minimize loss in the transmission of signals. When via holes are asymmetrically formed, testing showed that an electric field pattern generated by the transmission of signals was asymmetrically deformed.

Figure 5:
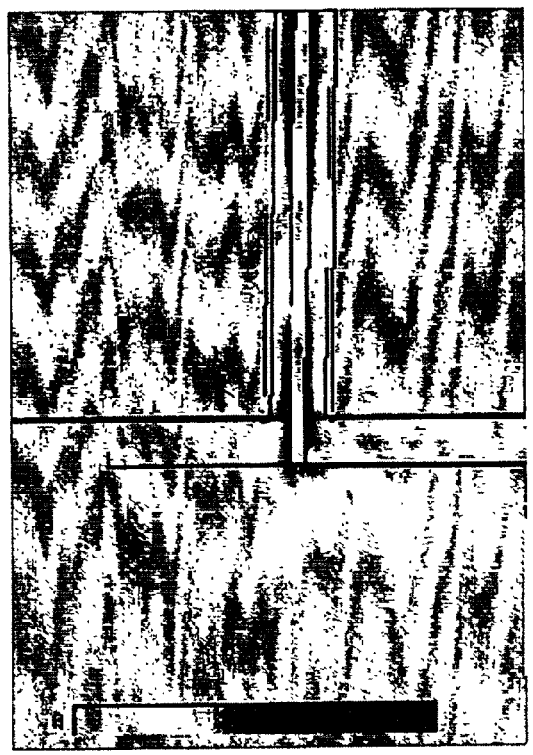
FIG. 5 is a diagram illustrating the pattern of an electric field generated in the structure shown in FIG. 3.

FIG. 5 is a diagram illustrating an electric field pattern generated by transmitted signals in a connection structure according to the illustrative embodiment of the present invention. Due to the transmission of signals, an electric field pattern is formed through a dielectric body to have a sine-wave shape, as shown in FIG. 5. Here, the gradual variation of the density of an electric field is represented by the gradual variation of the brightness of shading shown in a bar located at the lower end of FIG. 5. Accordingly, in FIG. 5, a portion having a higher electric field density is marked by a darker shade. In the embodiment of the present invention where the coaxial cable is vertically connected to a planar circuit substrate, according to FIG. 5, the dispersion of an electric field does not occur in the coaxial cable and is minimized at the connection between the coaxial cable and the planar circuit substrate.

As the result of measuring the electric field pattern in a connection structure according to the present invention, it was found that signals were successfully guided and transmitted from the coaxial cable to a micro strip line via a conductive welding portion without transmission loss.

Figure 6:
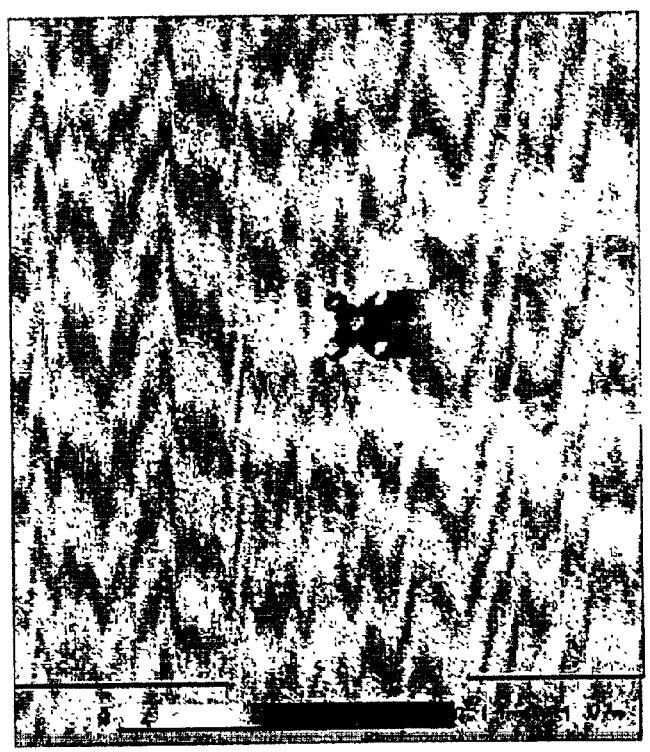
FIG. 6 is a diagram illustrating the pattern of an electric field generated in the structure shown in FIG. 4.

FIG. 6 is a diagram illustrating an electric field pattern occurring around a plurality of via holes. FIG. 6 shows that the via holes sufficiently guide signals transmitted from the coaxial cable.

As described above, according to the present invention, it is possible to improve the signal transmission capability of the coaxial cable by minimizing impedance mismatches without using a connector to connect the coaxial cable with the planar circuit substrate. In addition, since in the present invention, there is no need to bond an internal conductive line to the micro strip line with the use of wires, mass production of a connection structure of the coaxial cable is possible.

The above and other features of the invention including various and novel details of construction and combination of parts has been particularly described with reference to the accompanying drawings and pointed out in the claims. It will be understood that the particular construction and combination of parts embodying the invention is shown by way of illustration only and not as a limitation of the invention. The principles and features of this invention may be employed in varied and numerous embodiments without departing from the scope of the invention.

For example, a micro strip line for transmitting high-frequency signals has been described above. However, the structure of the micro strip line according to the present invention may be applied to a transmission line for transmitting radio frequency (RF) signals.

What is claimed is:

1. A connection structure comprising:
an external conductor of a coaxial cable which is electrically connected to a ground conductor installed at a surface of a planar circuit substrate; and
an internal conductor of the coaxial cable which is connected to a micro strip line installed at another surface of the planar circuit substrate,
wherein the internal conductor of the coaxial cable is welded to a conductive pattern of the micro strip line, and
wherein the conductive pattern of the micro strip line comprises:
a conductive welding portion welded to the internal conductor of the coaxial cable,
a conductive landing portion that extends from the conductive welding portion in a predetermined width, and
an impedance converting portion whose width increases as the impedance converting portion extends from the conductive landing portion.

2. The connection structure of claim 1, further comprising at least one via hole which is formed in a predetermined pattern in the planar circuit substrate, surrounding the conductive welding portion, to guide signals transmitted from the coaxial cable.

3. The connection structure of claim 2, wherein at least two of the via holes are formed in a symmetrical pattern in the planar circuit substrate.

4. The connection structure of claim 1, wherein the conductive welding portion is circular.

5. The connection structure of claim 1, wherein the coaxial cable is vertically coupled with the planar circuit substrate.

6. The connection structure of claim 1, wherein the width of the impedance converting portion increases gradually as the impedance converting portion extends from the conductive landing portion.

7. A connection structure comprising:
an external conductor of a coaxial cable which is electrically connected to a ground conductor installed at a surface of a planar circuit substrate; and an internal conductor of the coaxial cable which is connected to a micro strip line installed at another surface of the planar circuit substrate, wherein at least one via hole is prepared in a predetermined pattern in the planar circuit substrate around the internal conductor of the coaxial cable coupled with a portion of the micro strip line; and wherein a conductive pattern of the micro strip line comprises:
- a conductive welding portion welded to the internal conductor of the coaxial cable;
- a conductive landing portion extending from the conductive welding portion in a predetermined width; and
- an impedance converting portion extending from the conductive landing portion with an increasing width.

8. The connection structure of claim 7, wherein at least two via holes are formed in a symmetrical pattern in the planar circuit substrate.

9. A connection structure comprising:

an external conductor of a coaxial cable which is electrically connected to a ground conductor installed at a surface of a planar circuit substrate; and an internal conductor of the coaxial cable which is connected to a micro strip line installed at another surface of the planar circuit substrate, wherein the internal conductor of the coaxial cable is welded to a conductive pattern of the micro strip line, and wherein the conductive pattern of the micro strip line comprises:
- a conductive welding portion welded to the internal conductor of the coaxial cable,
- a conductive landing portion that extends from the conductive welding portion in a predetermined width,
- an impedance converting portion whose width increases as the impedance converting portion extends from the conductive landing portion, and
- a body portion which extends from an end of the impedance converting portion opposite the conductive landing portion and has a predetermined width.

10. The connection structure of claim 9, wherein a conductive pattern of the micro strip line comprises an impedance converting portion extending from the conductive landing portion with a gradually increasing width.

11. The connection structure of claim 9, wherein the width of the impedance converting portion increases gradually as the impedance converting portion extends from the conductive landing portion.

* * * * *